United States Patent [19]
Knauber et al.

[11] Patent Number: 5,295,046
[45] Date of Patent: Mar. 15, 1994

[54] CONTROL PANEL WITH EMI SCREEN

[75] Inventors: Steven K. Knauber; John D. Pechin, both of Grass Valley, Calif.

[73] Assignee: The Grass Valley Group, Inc., Nevada City, Calif.

[21] Appl. No.: 897,125

[22] Filed: Jun. 11, 1992

[51] Int. Cl.$^5$ .................................. H05K 9/00
[52] U.S. Cl. ........................ 361/816; 174/35 R
[58] Field of Search ............ 361/424, 816; 174/35 R, 174/35 MS

[56] References Cited

U.S. PATENT DOCUMENTS

| | | | |
|---|---|---|---|
| 4,810,830 | 3/1989 | Komine et al. | 361/424 |
| 5,134,245 | 7/1992 | Katz | 361/424 |
| 5,139,850 | 8/1992 | Clarke et al. | 174/35 MS |
| 5,170,009 | 12/1992 | Kadokura | 174/35 R |
| 5,204,807 | 4/1993 | Simkins et al. | 361/424 |

Primary Examiner—Paula A. Bradley
Attorney, Agent, or Firm—John Smith-Hill; Francis I. Gray

[57] ABSTRACT

A control panel for a television digital special effects device comprises a plastic shroud that has an internal conductive coating and defines a key panel cavity. A key panel plate fits within the key panel cavity. A thin stainless steel EMI screen is adhesively bonded to the upper surface of the key panel plate and an overlay sheet is adhesively bonded to the upper surface of the EMI screen. Apertures for the keys, controls and displays of the control panel are present in registration in the key panel plate, the EMI screen and the plastic overlay. The EMI screen has a main body with fingers projecting from its periphery. The dimensions of the main body of the EMI screen are smaller than the corresponding dimensions of the key panel cavity in the plastic shroud, while the finger-tip-to-finger-tip dimensions of the screen are larger than those corresponding dimensions. Thus, as the plastic shroud is pressed down over the key panel sub-assembly during assembly, the fingers are bent into firm contact with the conductive coating on the interior of the plastic shroud, thereby providing good electrical contact between the EMI screen and the conductive coating of the plastic shroud, which also serves an EMI shielding function.

6 Claims, 3 Drawing Sheets

CONTROL PANEL WITH EMI SCREEN

BACKGROUND OF THE INVENTION

This invention relates to electromagnetic interference (EMI) shielding, and more particularly to an apparatus for cost-effectively creating a high quality EMI screen over a key panel.

If an electronic device, such as a television digital special effects device, contains sources of radio frequency or other electromagnetic interference, and also presents openings to the world outside of its chassis, it acts as a source of EMI. This is particularly true if the openings in its chassis have long dimensions; the longer the dimensions, the longer the wavelengths that can pass through the opening, and the greater the range of radiated frequencies that can escape into the environment. Conversely, the smaller the chassis openings are, the shorter the wavelengths have to be in order to escape. When the only frequencies that can escape are higher in frequency than any signals present in the instrument, the instrument ceases to be an EMI source.

Since EMI is regulated by the Federal Communications Commission (FCC) in the United States and even more strictly in the Federal Republic of Germany by the Verband Deutscher Elektrotechniker (Association of German Electrical Engineers), such transmissions may constitute an unacceptable behavior of the instrument that renders it unmarketable in a number of important countries.

SUMMARY OF THE INVENTION

In accordance with the invention, there is provided a control panel for a television digital special effects device that has an EMI screen for reducing the amount of electromagnetic interference that it emits. In this control panel, a plastic shroud having an internal conductive coating defines a key panel cavity and presses down onto a key panel that fits within the cavity. A thin stainless steel EMI screen is adhesively bonded to the upper surface of the key panel, and an overlay sheet is adhesively bonded to the upper surface of the EMI screen. Apertures for the keys, controls and displays of the control panel are present in registration in the key panel, the EMI screen and the overlay sheet. The EMI screen has a main body and fingers projecting from the main body at its periphery. The transverse dimensions of the main body of the EMI screen as measured from gap-to-gap are smaller than the corresponding dimensions of the key panel cavity in the plastic shroud, while the finger-tip-to-finger-tip transverse dimensions are larger than those corresponding dimensions. Thus, as the plastic shroud is pressed down over the key panel during assembly, the fingers are bent into firm contact with the conductive coating on the interior of the plastic shroud, thereby providing good electrical contact between the EMI screen and the conductive coating of the plastic shroud, which also serves an EMI shielding function.

BRIEF DESCRIPTION OF THE DRAWINGS

For a better understanding of the invention, and to show how it may be carried into effect, further reference will be made, by way of example, to the accompanying drawings in which.

DETAILED DESCRIPTION

Figure 1:
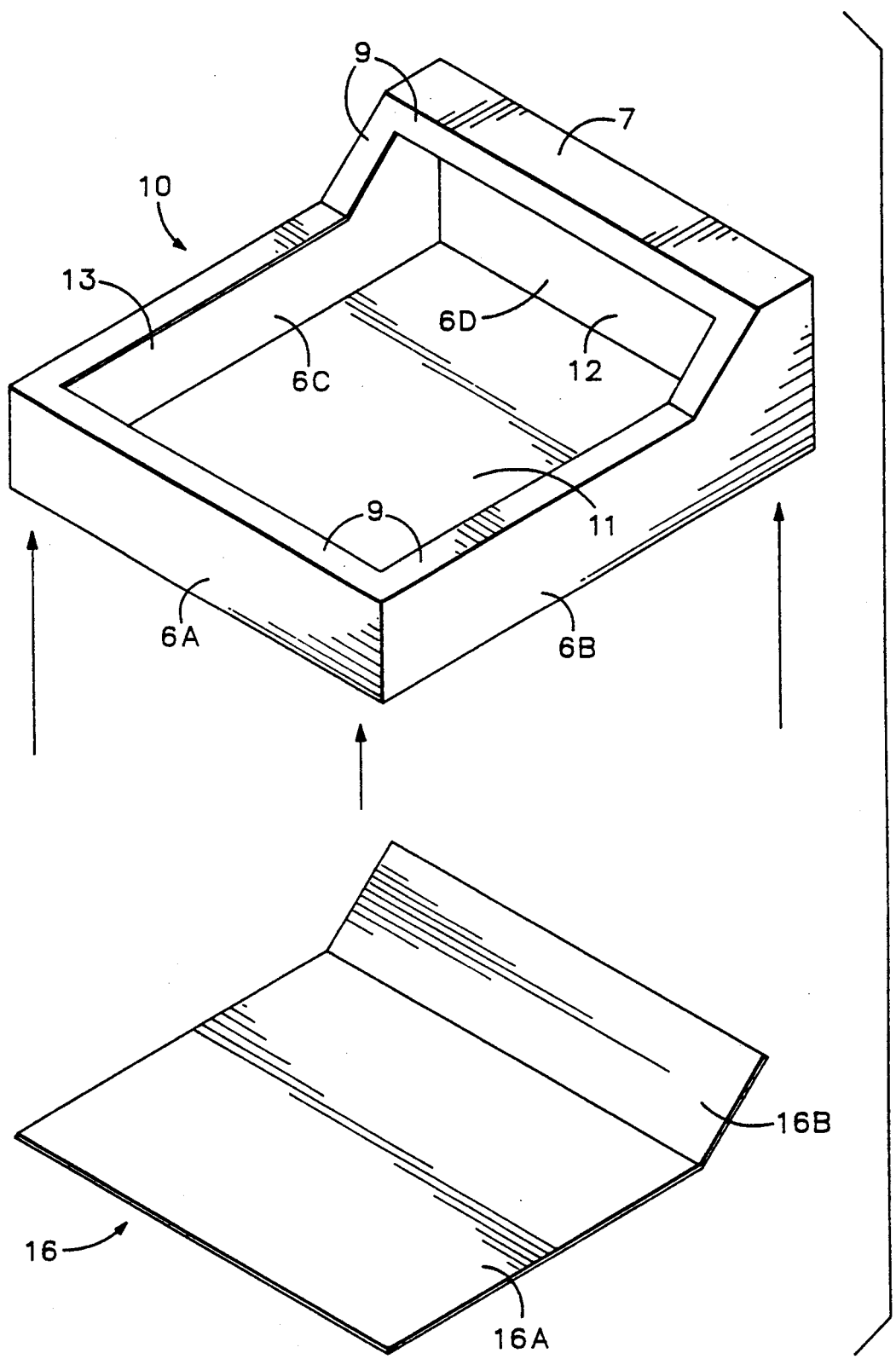
FIG. 1 is a perspective exploded view of a control panel with an EMI screen according to the present invention.

FIG. 1 is perspective exploded view of a control panel or console. The control panel comprises a plastic shroud 10 that has a conductive coating 12 over the whole of its interior. The plastic shroud has a front wall 6A, two side walls 6B, 6C and a back wall 6D. The walls 6 have essentially flat interior surfaces defining a key panel cavity 11. The front wall 6A is lower than the back wall 6D, and the two side walls 6B and 6C each have a low segment, a high segment and a transition segment joining the low and high segments. It will therefore be appreciated that the height of the key panel cavity 11 is uniform over the major portion of the front-to-back dimension of the control panel but increases at the back of the control panel. A shelf 7 projects forwardly from the top of the back wall, and a lip or flange 9 projects inwardly from the walls 6A–6C and the shelf 7 and defines a panel aperture 13.

The plastic shroud is formed by injection molding, and the draft angle of the mold results in the essentially flat interior surfaces of the wall 6 converging slightly in the upward direction. Therefore, at the back of the control panel the minimum width of the cavity 11 is somewhat less than the minimum width of the cavity at the front of the control panel.

The control panel also comprises a key panel sub-assembly 16 that fits within and is surrounded by the plastic shroud 10. The key panel sub-assembly 16 has a major planar portion 16A and a minor portion 16B disposed at an oblique angle to the portion 16A. The minor portion 16B is adapted to extend into the portion of the cavity 11 where the height of the cavity increases toward the back of the control panel.

Figure 2:
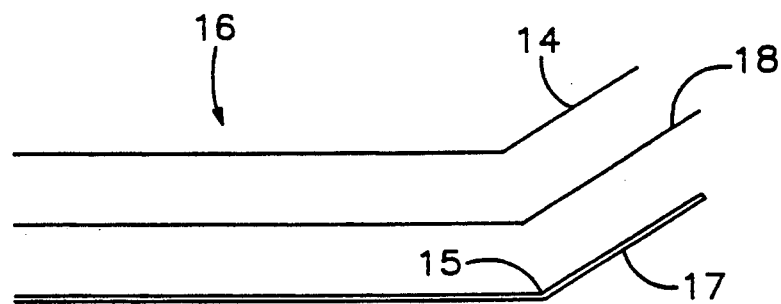
FIG. 2 is cross-sectional exploded view of a portion of the control panel according to the present invention.
Figure 3:
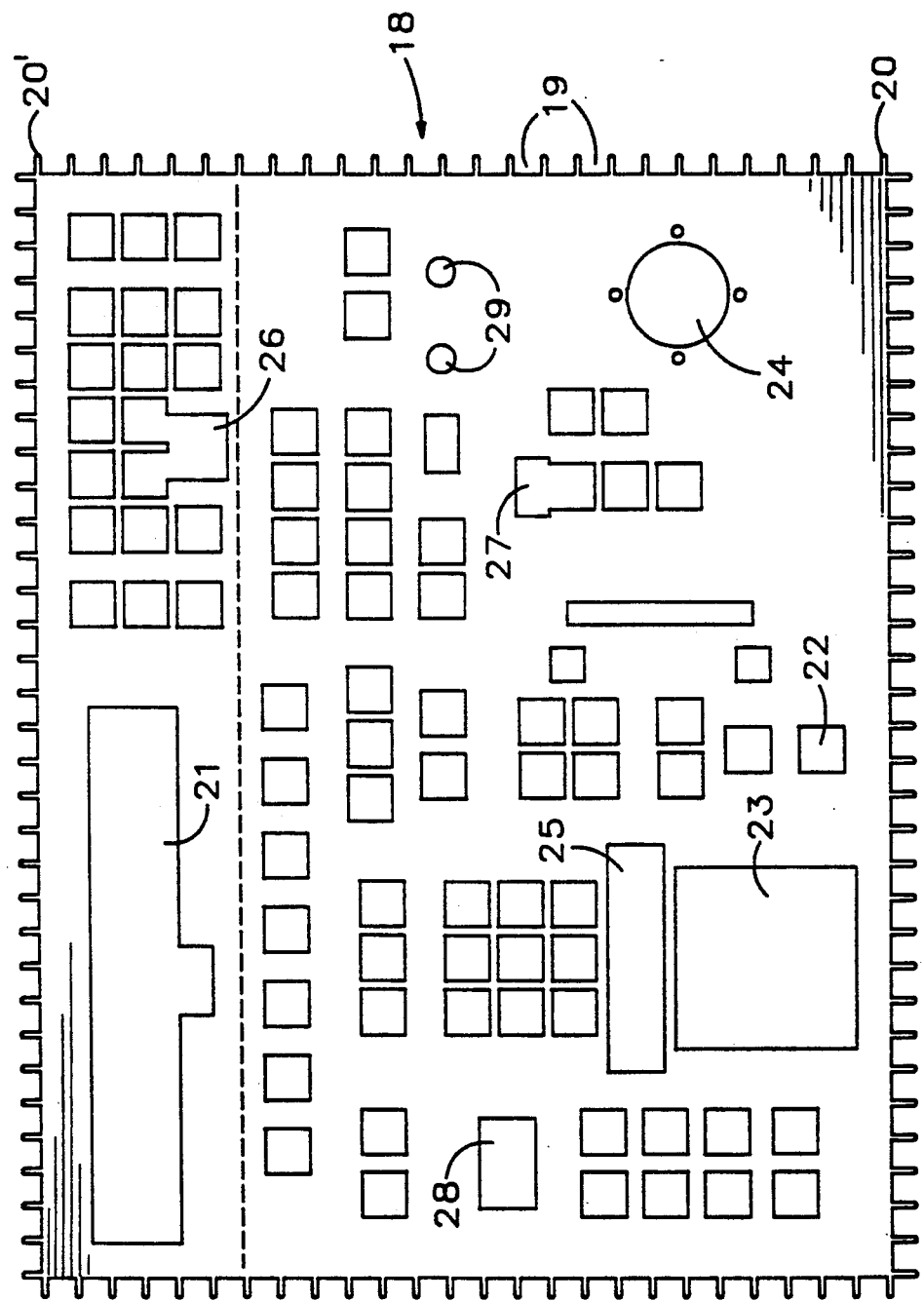
FIG. 3 is plan view of the screen layer of the control panel according to the present invention.

Referring to FIG. 2, the key panel sub-assembly 16 is formed from a stiff rectangular key panel plate 17 that has been bent at 15, an insulating plastic overlay 14, and an EMI screen 18 of conductive material sandwiched between the key panel plate 17 and the plastic overlay 14. Referring to FIG. 3, the EMI screen 18 has a main body that conforms in shape and size to the key panel plate 17. Fingers 20, which are spaced apart by gaps 19, project from the rectangular main body of the EMI screen 18. The main body of the EMI screen is formed with various apertures 21–29. The plastic overlay 14 conforms to the shape and size of the key panel plate 17 and is provided with an identical pattern of apertures (not shown) to the EMI screen and the key panel plate 17 also is provided with an identical pattern of apertures (not shown). The EMI screen 18 is bonded to the key panel plate 17 using a UV curable adhesive, such as the adhesive sold by Acheson Colloid under the designation UVC 8200. The plastic overlay 14 is bonded to the EMI screen 18 using a sheet adhesive, such as the adhesive sold by 3M Corporation under the designation 467. In this manner, a sandwich structure 17/18/14 is formed in which the apertures in the key panel plate, the EMI screen and the plastic overlay are in registration. The pattern of apertures corresponds to the desired layout of keys, controls and indicators of the video special effects system. The keys, controls and indicators are attached to sandwich structure and protrude through the apertures in the sandwich structure. The plastic overlay 14 bears legends associated with the keys, controls and indicators.

The control panel also comprises an instrument chassis (not shown) that includes a metal frame to which various electronic components are attached. The electronic components are connected to the keys, controls and indicators. In operation, the electronic components constitute a source of electromagnetic radiation, which is illustrated schematically in FIG. 5 as a block 30.

Figure 5:
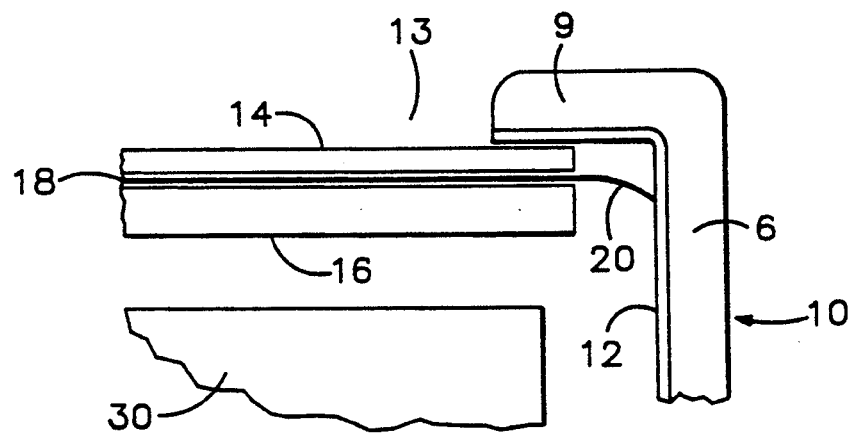
FIG. 5 is cross-sectional view of a portion of the control panel of the present invention in its assembled form.

The key panel sub-assembly 16, comprising the sandwich structure and the keys, controls and indicators attached thereto, is held in position over the instrument chassis by stand-offs and the plastic shroud 10 is lowered over the key panel sub-assembly and is attached to the instrument chassis by screws that establish electrically conductive connection between the instrument chassis and the conductive coating 12. The plastic overlay is exposed through the key panel aperture as shown in FIG. 5. Because the EMI screen is bonded to the key panel plate 17 and the plastic overlay 14, the sub-assembly 16 remains as one unit if it should later be removed from the plastic shroud, e.g. for servicing the control panel.

The dimensions of the stiff rectangular key panel plate 17, and consequently also of the main body of the EMI screen and of the plastic overlay, are such that the key panel sub-assembly fits inside the plastic shroud without bending the key panel plate 17. The fingers 20 project sufficiently from the main body of the EMI screen that when the key panel sub-assembly is fitted inside the shroud, the fingers bend and the tips of the fingers engage the conductive coating 12 on the interior surfaces of the plastic shroud, as shown in FIG. 5. The fingers 20 vary in length along the front-to-back edges of the screen from about 0.4 cm for the shortest fingers 20', which are at the back of the key panel sub-assembly, to about 1.0 cm for the longest fingers 20, which are at the front of the key panel sub-assembly. The variation in length of the fingers allows the width of the main body of the EMI screen to be uniform, while accommodating the slight reduction in minimum width of the cavity 11 towards the back of the control panel. The discrete fingers 20 accommodate irregularities in the surface of the plastic shroud 10 and its conductive coating 12.

The EMI screen is preferably fabricated from 0.005 inch (13 μm) stainless steel and the fingers 20 are approximately 0.2 cm in width. Therefore the fingers exert a sufficient restoring force to keep them in firm electrical contact with the conductive coating 12. Therefore, a solid, low impedance ground is provided all around the periphery of the key panel sub-assembly.

Figure 4:
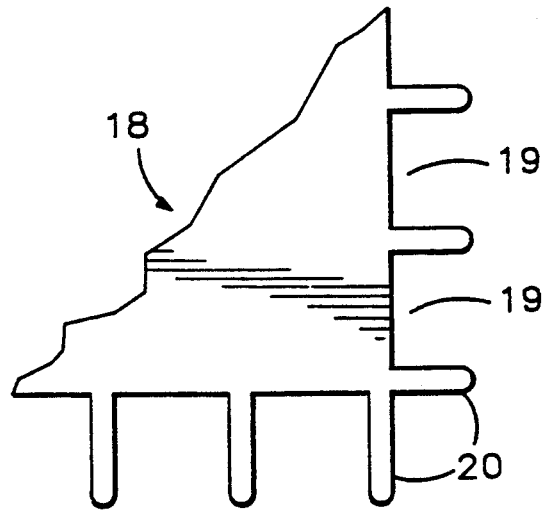
FIG. 4 is detail view of a portion of the screen layer shown in FIG. 3.

Referring now to FIG. 4, the fingers 20 are on 1.3 cm centers. Thus, the width of the gaps 19 is about 1.1 cm, which corresponds to the wavelength of electromagnetic radiation with a frequency of about 27 GHz. Therefore, while these gaps 19 will freely pass electromagnetic radiation at a frequency of 27 GHz or above, they will almost completely block electromagnetic radiation at a tenth of this frequency or lower, i.e., 2.7 GHz or lower.

In a preferred embodiment, the key panel plate 17 is ⅛ inch (0.32 cm) anodized aluminum, the EMI screen 18 is 0.005 inch (13 μm) stainless steel and the plastic overlay 14 comprises two layers bonded together with clear acrylic adhesive. The top layer of the plastic overlay 14 is a film of hardcoated polycarbonate having a thickness of 0.010 inches (0.25 mm). The hardcoating has a 35% gloss and is achieved with "Marnot" produced by the Tekra Corporation of New Berlin, Wis. Suitable polycarbonate film is produced by the Plastics Operations Division, Sheet Products Department of the General Electric Company, Pittsfield, Mass. and is sold under the trademark LEXAN. The bottom layer of the plastic overlay 14, the layer that is closest to the EMI screen 18, is 0.020 inches (0.51 mm) thick polyester glycol copolymer. The clear acrylic adhesive layer that binds the two plastic layers together is 0.002 inches (0.051 mm) thick.

The plastic shroud is made of Cycolac brand ABS plastic made by Borg-Warner Chemicals, Inc., International Center, Parkersburg, W. Va. The particular Cycolac is a flame retardant thermoplastic material designated as grade KJM.

The conductive coating 12 is a 0.002 inches (5 μm) thick layer of sprayable metallic coating, such as Series 599-Z1150 Water Base Copper Conductive Coating produced by the Spraylat Company of Mt. Vernon, N.Y. Los Angeles, Calif. and Chicago, Ill. to provide a maximum resistivity of 300 mΩ/sq.

For different applications, it might be desirable to vary the foregoing materials and dimensions. For instance, while stainless steel is used in the preferred embodiment because of its cost and galvanic compatibility with the anodized aluminum of the key panel plate 17, other metals, such as beryllium copper alloy, could instead be employed. Further, it might be desirable to fabricate the EMI screen from stock with a thickness between 0.002 inches and 0.01 inches (5 μm to 25 μm), depending on the geometry of the key panel sub-assembly and the material used. Similarly, it might be desirable to vary the width and spacing of the fingers depending on the requirements of the application. The width of the fingers 20 could reasonably vary from 0.1 cm to 0.4 cm and the width of the gaps 19 could reasonably vary from 0.2 cm to 1.5 cm. Gaps of 0.2 cm would correspond to a cut-off frequency of about 15 GHz, while gaps of 1.5 cm would correspond to a cut-off frequency of about 2.0 GHz. Since the shielding effect of the EMI screen 20 is compromised by the presence of all of the apertures 21-29 that it must accommodate, and the keys, controls and indicators that fill those apertures in many cases permit EMI leakage, reducing the gap size quickly begins to produce diminishing returns in the overall effectiveness of the shielding that is achieved.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope of the invention.

What is claimed is:

1. A control panel for an electronic instrument comprising:
   a shroud of an insulating material having a metallic conductive coating substantially covering an interior surface, the shroud defining a key panel aperture; and a key panel sub-assembly, said key panel sub-assembly comprising a stiff key panel plate, an overlay sheet of which the size and shape approximate the size and shape of the key panel plate, and an EMI screen of conductive, resilient material, the EMI screen having a major portion of which the size and shape approximate the size and shape of the key panel plate and also having fingers projecting from the periphery of the major portion, the key panel plate, the EMI screen and the overlay sheet being arranged as a sandwich structure with the EMI screen between the key panel plate and the overlay sheet, and the key panel sub-assembly being positioned inside the shroud with the overlay sheet exposed through the key panel aperture and the fingers of the EMI screen flexed and in electrically conductive contact with the conductive coating of the interior of the shroud.

2. A control panel according to claim 1, wherein the EMI screen comprises stainless steel.

3. A control panel according to claim 1, wherein the EMI screen has a thickness in the range from about 5 $\mu$m to about 25 $\mu$m.

4. A control panel according to claim 1, wherein the fingers have a width within the range from about 0.1 cm to about 0.4 cm and the fingers have gaps therebetween, the gaps having a width within the range from about 0.2 cm to about 1.5 cm.

5. A control panel according to claim 1, wherein the sandwich structure is formed with apertures and the key panel sub-assembly further comprises controls and indicators that are supported by the sandwich structure and project through the apertures.

6. An electronic instrument comprising a control panel according to claim 1 and a source of electromagnetic radiation within the shroud, wherein the fingers are separated by a distance that is less than one tenth of the wavelength of the highest frequency electromagnetic radiation emitted by said source.

* * * * *